(12) United States Patent
Lee et al.

(10) Patent No.: US 8,343,881 B2
(45) Date of Patent: Jan. 1, 2013

(54) SILICON DIOXIDE LAYER DEPOSITED WITH BDEAS

(75) Inventors: Yong-Won Lee, San Jose, CA (US); Vladimir Zubkov, Mountain View, CA (US); Mei-Yee Shek, Palo Alto, CA (US); Li-Qun Xia, Cupertino, CA (US); Prahallad Iyengar, Mountain View, CA (US); Sanjeev Baluja, Campbell, CA (US); Scott A Hendrickson, Brentwood, CA (US); Juan Carlos Rocha-Alvarez, San Carlos, CA (US); Thomas Nowak, Cupertino, CA (US); Derek R Witty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 201 days.

(21) Appl. No.: 12/794,713

(22) Filed: Jun. 4, 2010

(65) Prior Publication Data

US 2011/0298099 A1    Dec. 8, 2011

(51) Int. Cl.
*H01L 29/06* (2006.01)
*H01L 21/31* (2006.01)
*C23C 16/448* (2006.01)

(52) U.S. Cl. .................. 438/787; 257/632; 257/E21.24; 257/E29.006

(58) Field of Classification Search .................. 257/632, 257/E21.24, E29.006; 438/787
See application file for complete search history.

(56) References Cited

U.S. PATENT DOCUMENTS

| | | | |
|---|---|---|---|
| 7,638,170 | B2 | 12/2009 | Li |
| 2008/0311746 | A1 | 12/2008 | Dussarrat |
| 2009/0029036 | A1 | 1/2009 | Dussarrat |
| 2009/0074652 | A1 | 3/2009 | Dussarrat |
| 2009/0075490 | A1 | 3/2009 | Dussarrat |
| 2009/0203222 | A1 | 8/2009 | Dussarrat et al. |
| 2009/0311879 | A1 | 12/2009 | Blasco et al. |
| 2010/0081094 | A1 | 4/2010 | Hasebe et al. |
| 2010/0112496 | A1 | 5/2010 | Nakajima et al. |
| 2010/0112796 | A1 | 5/2010 | Chou et al. |
| 2010/0130015 | A1 | 5/2010 | Nakajima et al. |
| 2010/0136313 | A1 | 6/2010 | Shimizu et al. |

FOREIGN PATENT DOCUMENTS

| | | |
|---|---|---|
| KR | 10-2009-0051186 A | 5/2009 |
| KR | 10-2009-0057023 A | 6/2009 |
| KR | 10-2010-0036214 A | 4/2010 |
| WO | WO2006097525 | 9/2006 |
| WO | WO2008142653 | 11/2008 |
| WO | WO2010023277 | 3/2010 |

OTHER PUBLICATIONS

Sunohara, M. et al. "Silicon Interposer with TSVs (Through Silicon Vias) and Fine Multilayer Wiring" Proceedings of 2008 Electronic Components and Technology Conference, May 27-30, 2008, pp. 847-852.
Kim, Sang Joon, International Search Report of International Application No. PCT/US2011/039145, Jan. 11, 2012.

*Primary Examiner* — Benjamin Sandvik
*Assistant Examiner* — Whitney T Moore
(74) *Attorney, Agent, or Firm* — Ashok K. Janah; Janah & Associates, P.C.

(57) ABSTRACT

A silicon dioxide layer is deposited onto a substrate using a process gas comprising BDEAS and an oxygen-containing gas such as ozone. The silicon dioxide layer can be part of an etch-resistant stack that includes a resist layer. In another version, the silicon dioxide layer is deposited into through holes to form an oxide liner for through-silicon vias.

20 Claims, 8 Drawing Sheets

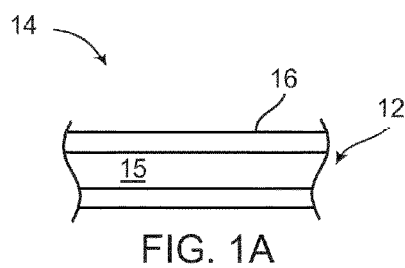
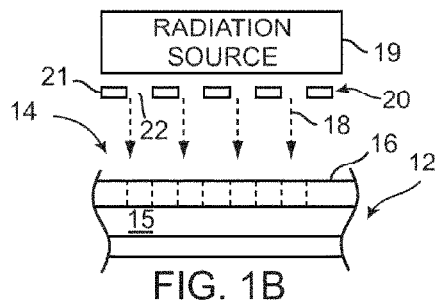
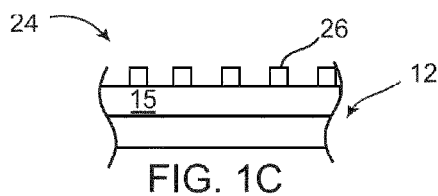
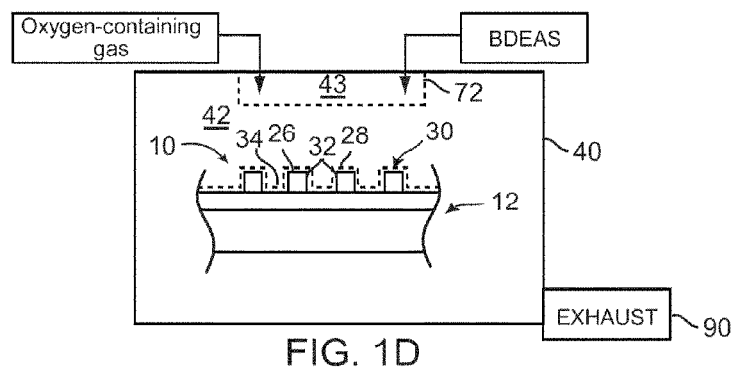
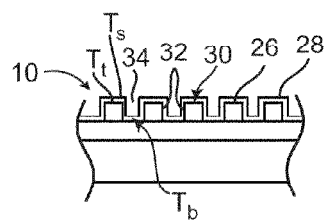

SILICON DIOXIDE LAYER DEPOSITED WITH BDEAS

BACKGROUND

Embodiments of the present invention relate to the deposition of silicon dioxide layers in the fabrication of electronic circuits.

Electronic circuits, such as integrated circuits, display circuits, memory circuits, and power circuits, are being made ever smaller to increase portability and computing power. Silicon dioxide layers are used in a variety of applications in the fabrication of the active and passive features of the electronic circuits. In one application, silicon dioxide layers are used in the fabrication of multilayer etch-resistant stacks, as for example disclosed in U.S. Pat. No. 6,136,511, entitled "Method of patterning substrates using multilayer resist processing", to Reinberg et al., and filed on Jan. 20, 1999, which is incorporated by reference herein in its entirety. An exemplary multilayer stack comprises a base resist layer, a middle spacer layer of silicon dioxide that serves to protect the underlying base resist, and a top imaging resist layer that is sensitive to energy, such as light, X-ray or electron energy. A high resolution pattern can be created in the thin imaging resist layer using lithographic processes. Thereafter, this pattern is transferred to the underlying spacer and resist layer to create a multilayer stack. However, it is difficult to form a spacer layer of silicon dioxide over the photoresist layer without damaging or eroding the underlying photoresist layer. This is because conventional silicon dioxide layers are often deposited at temperatures in excess of 200° C. At these temperatures, the underlying photoresist layer is eroded by the active oxygen ions in the plasma used to deposit the silicon dioxide on the photoresist. Reducing the silicon dioxide deposition temperatures can reduce photoresist damage, however, low temperature deposition processes often result in the deposition of a non-conformal silicon dioxide layers. Further, active radicals in the plasma, such as $O^{-2}$, $OH^-$, or $Cl^{-2}$, can modify the photosensitive structure of the photoresist layer to provide poor patterning results. Thus, it is difficult to deposit spacer coatings of silicon dioxide on a resist layer at low temperatures or without damaging or eroding the resist layer.

In another application, silicon dioxide layers are used in the fabrication of through-silicon vias (TSV) which are used to connect electrically the active and passive features in different, vertically stacked, silicon plates. In TSV fabrication methods, through holes are etched in a silicon plate, and filled with an electrical conductor to serve as a vertical interconnect access structure. In such structures, a silicon dioxide layer can be used to line the walls of the through holes before deposition of the metal-containing material therein. The silicon dioxide liner can, for example, serve as an insulating layer, diffusion barriers, hermetic seal, moisture resistance, or still other reasons. However, in the process for fabricating TSV features, a plurality of silicon plates are bonded to one another with an adhesive which flows and can even degrade at temperatures above 200° C. Conventional silicon dioxide processes operate at higher temperatures and cannot be used for the fabrication of TSVs.

For various reasons that include these and other deficiencies, and despite the development of various methods of depositing silicon dioxide layers, further improvements in the deposition of silicon dioxide are continuously being sought.

SUMMARY

A method of forming a multilayer etch-resistant stack on a substrate comprises forming a patterned resist layer having a plurality of resist features that are spaced apart from one another, and depositing a silicon dioxide layer on the resist features of the patterned resist layer by: (i) placing the substrate with the patterned resist layer in a process zone; and (ii) introducing into the process zone, a process gas comprising BDEAS and an oxygen-containing gas.

An intermediate product is used in the fabrication of an electronic circuit, the intermediate product comprising: a substrate; a patterned resist layer on the substrate, the pattered resist layer having a plurality of spaced apart resist features which have top surfaces and sidewalls, and spacing gaps between the resist features; and a silicon dioxide layer conformal to the resist features of the patterned resist layer, the conformal silicon dioxide layer covering the top surfaces and sidewalls of the resist features in a thickness that deviates by less than 5%.

A substrate processing apparatus deposits a silicon dioxide layer on a substrate, the apparatus comprising: a substrate support to receive a substrate in a process zone, the substrate having a patterned resist layer with a plurality of spaced apart resist features having top surfaces and sidewalls, and spacing gaps between the resist features; an ozone generator capable of generating ozone; a BDEAS vaporizer to generate BDEAS vapor; and a process gas distributor comprising a gas manifold having a first gas conduit to receive the BDEAS vapor and a second gas conduit to receive the ozone, such that the BDEAS and ozone mix in a mixing zone immediately above the process zone prior to release of the mixed BDEAS and ozone into the process zone.

A through-silicon via fabrication method comprises etching a plurality of through holes in a silicon plate, the through holes comprising sidewalls and bottom walls. A silicon dioxide layer is deposited on the sidewalls and bottom walls of the through holes, by providing in a process zone, the silicon plate having the plurality of through holes, and introducing into the process zone, a process gas comprising BDEAS and an oxygen-containing gas.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIGS. 1A to 1E are schematic cross-sectional views of a substrate at different processing stages in the fabrication of a multilayer etch-resistant stack, which include: FIG. 1A—forming a resist layer on a substrate; FIG. 1B—exposing the resist layer to a pattern of radiation; FIG. 1C—forming a patterned resist layer having a plurality of resist features that are spaced apart from one another in a lithography process; FIG. 1D—deposition of a conformal silicon dioxide layer on the resist features of the patterned resist layer in a process zone; and FIG. 1E—the substrate having a multilayer etch-resistant stack thereon;

FIGS. 2A to 2G are schematic cross-sectional views of a substrate at different processing stages in the fabrication of through-silicon vias in a substrate, which include: FIG. 2A—showing a patterned resist layer on a substrate; FIG. 2B—etching through holes in the silicon plate; FIG. 2C—depositing a conformal silicon dioxide layer in the through holes; FIG. 2D—etching off the silicon dioxide deposited on the bottom walls of the through holes in the silicon plate; FIG.

2E—depositing a metal-containing material in the through holes in the silicon plate; FIG. 2F—flipping the substrate over and chemical mechanical polishing the surface; and FIG. 2G—through-silicon vias having exposed contact regions of the metal-containing material in the through holes;

Figure 8:
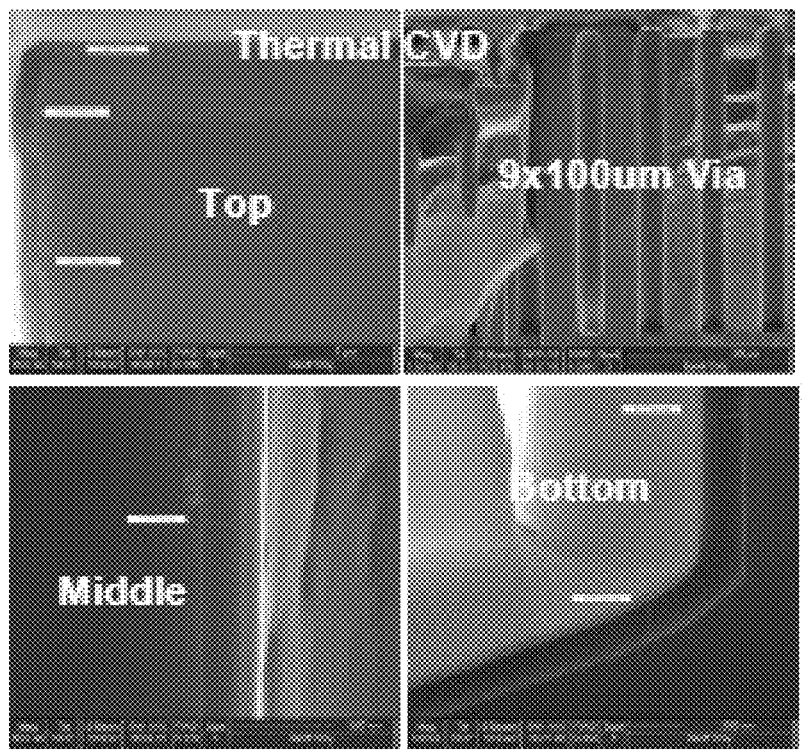
Figure 9:
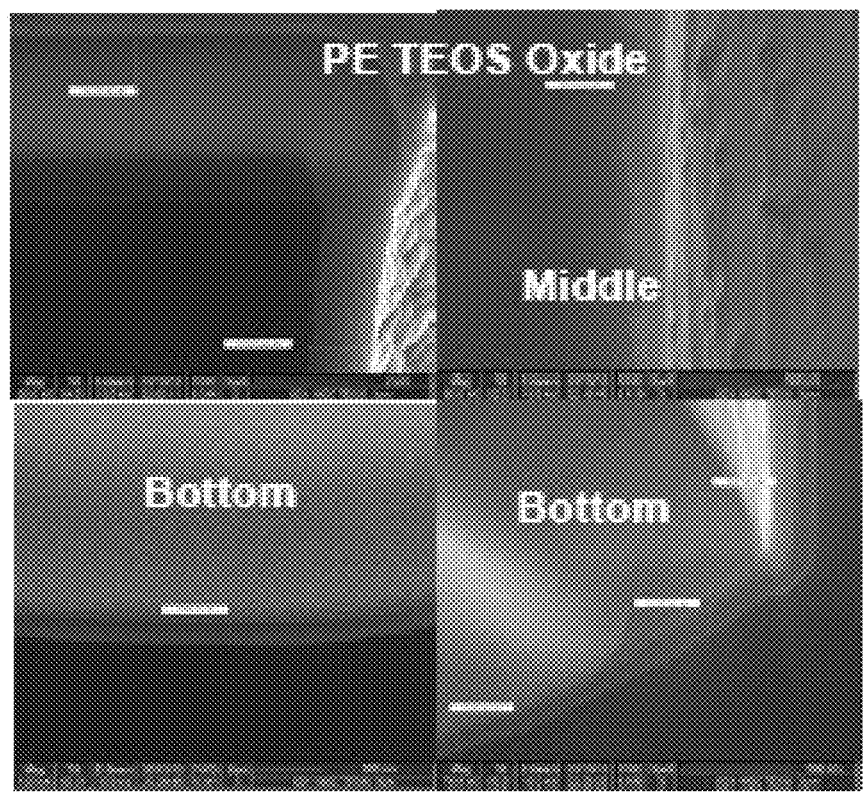

FIG. 8 are scanning electron micrographs of a cross section of a TSV feature with a BDEAS-deposited silicon dioxide layer showing the top, entire cross section of a through hole, bottom and middle portions, as labeled; and FIG. 9 are scanning electron micrographs of a cross section of a TSV feature with a conventional PECVD-deposited silicon dioxide layer showing the top, middle and bottom corner, and bottom flat portions of the through hole, as labeled.

DESCRIPTION

Silicon dioxide layers deposited by the current processes on substrates have different applications. The substrates can be, for example, (i) a semiconducting wafer such as a silicon wafer, germanium wafer, or silicon germanium wafer; (ii) a compound semiconductor wafer such as gallium arsenide; or (iii) a dielectric panel, such as a glass or polymer panel, and which can include borophosphosilicate glass, phosphosilicate glass, borosilicate glass, and phosphosilicate glass, polymers and other materials. The substrate 12 can also include one or more layers 15, as shown in FIG. 1A, which may be made from metal-containing, dielectric or semiconducting materials. The layers 15 can represent a single continuous layer, segmented layer, or different active or passive features, such as integrated circuits, display components, photovoltaic components, transistors, and the like, which are located in the substrate 12 or on the surface of the substrate 12.

An exemplary embodiment of a process useful for fabricating a multilayer etch-resistant stack 10 on a substrate 12, is illustrated in FIGS. 1A to 1E. A resist layer 14 is formed on the substrate 12 as shown in FIG. 1A. Typically, the resist layer 14 is deposited over the layer 15 which is already on the substrate 12. However, the resist layer 14 can also be formed directly on the substrate 12. The resist layer 14 is patterned to form a patterned resist layer 24 having resist features 26 which serve as etch-resistant features to transfer a pattern to the underlying layer 15 on the substrate 12 by etching through the exposed portions of the layer 15 that lie between the resist features 26.

In one version, the resist layer 14 is a photoresist layer 16, which is a radiation-sensitive material which is not limited to photon or light-sensitive materials, and can be a light-sensitive, electron-sensitive, X-ray sensitive and other radiation 18-sensitive materials. In one version, the photoresist layer 16 is a positive photoresist or negative photoresist which is sensitive to light. A positive resist is one in which the portion of the photoresist that is exposed to light becomes soluble to a photoresist developer, and the portion that is unexposed remains insoluble to a photoresist developer. A negative resist is one in which the portion of the photoresist that is exposed to light becomes insoluble to the photoresist developer, and the unexposed portion is dissolved by the photoresist developer. The photoresist layer 16 can be a photoresist material, such as Polymethylmethacrylate (PMMA), PolyMethylGlutarimide (PMGI), Phenol formaldehyde resin, diazonaphthoquinone (DNQ) and novolac resin (a phenol formaldehyde resin, and SU-8 which is an epoxy-based negative photoresist. Resist layers 14 are available from Hoechst AZ 4620, Hoechst AZ 4562, Shipley 1400-17, Shipley 1400-27, Shipley 1400-37, and Shipley Microposit Developer. In one version, the photoresist layer 16 is formed to a thickness of from about 20 to about 500 nm, for example, from about 50 to about 200 nm, or even about 120 to 150 nm.

The resist layer 14 can be applied as a liquid by dip coating or spin-coating. In the spin-coating process, the liquid resist is dispensed over the surface of the substrate 12, while the substrate 12 is rapidly spun around until it becomes dry. Spin-coating processes are often conducted at spinning speeds of from about 3000 to about 7000 rpm for about 20 to about 30 seconds. Resist coating is followed by a soft bake process which heats spin-coated resist layer to evaporate the solvent from the spun-on resist, improve the adhesion of the resist to the substrate 12, or even anneal the resist layer 14 to reduce shear stresses which are introduced during spin-coating. Soft baking can be performed in an oven, such as a convection, infrared, or hot plate oven. The typical temperature range for soft baking is from about 80 to about 100° C. As another example, dry films can also be applied, such as polymer films, which are radiation-sensitive. Dry films may or may not need to be baked or cured depending on the nature of the film.

Thereafter, the resist layer 14, comprising, for example, the photoresist layer 16, is exposed to a pattern of radiation 18 provided by a radiation source 19 through a mask 20 as shown, for example, in FIG. 1B. The mask 20 can be a plate 21 with holes 22 (as shown) or transparent portions (not shown) that correspond to a pattern which allows radiation 18 to selectively permeate through portions of the mask to form a radiation pattern of intersecting lines or arcs. The masks 20 are fabricated by conventional methods.

In one version, the photoresist layer 16 is a light-sensitive material such as diazonaphthoquinone. The radiation source 19 provides ultraviolet light having wavelengths of less than 300 nm, for example, about 248 nm, such as a Mercury lamp. The photoresist layer 16 comprising diazonaphthoquinone (DNQ) absorbs strongly light having wavelengths from about 300 nm to about 450 nm.

In another version, the photoresist layer 16 is a positive photoresist based on a mixture of diazonaphthoquinone (DNQ) and novolac resin (a phenol formaldehyde resin). A suitable radiation source 19 for this photoresist is a mercury-vapor lamp, set to provide light comprising I, G and H-lines from the mercury-vapor lamp.

In still another version, the photoresist layer 16 comprises SU-8, which is a viscous polymer that can be spun or spread over a thickness ranging from 0.1 micrometer to 2 millimeters and processed with standard contact lithography. Advantageously, this photoresist layer 16 can be used to pattern resist features 26 which have a high aspect ratio (which is the ratio of the height to the width of the feature) that is equal to or greater than 20. In this version, the radiation source 19 provides ultraviolet light having a wavelength of 193 nm.

In yet another version, the photoresist layer 16 comprises an electron-sensitive material, and the radiation source 19 is an electron beam source. Electron beam lithography usually relies on photoresist materials which are specifically for electron-beam exposure. Conventional electron beam lithography techniques and materials can be used.

After the resist layer 14 is exposed to radiation 18 to create a pattern in the resist layer 14, the exposed resist layer 14 is developed to form a patterned resist layer 24 having a plurality of resist features 26 that are spaced apart from one another, as shown in FIG. 1C. In the development step, the radiation-exposed photoresist layer 16 is treated with a liquid developer to set in the exposed and unexposed portions to form the patterned resist layer 24. The liquid developer initiates chemical reactions in the exposed resist layer 14 in which unexposed or exposed portions of the photoresist layer 16 dissolve in the developer depending on whether the resist is a positive resist or a negative resist. Suitable developers include dilute solutions of a base, such as sodium or potassium carbonate. For example, the developer can be as a 1% solution of sodium carbonate monohydrate ($Na_2CO_3.H_2O$), or potassium carbonate ($K_2CO_3$), sodium hydroxide, or mixtures thereof. Automated pH-controlled feed and bleed developing can also be used with pH levels set to about 10.5. The resist layer 14 can also be developed by immersion or spraying in the selected developer. After development, the substrate 12 with the resist features 26 is rinsed and dried to ensure that development will not continue after the developer has been removed from the substrate 12.

In the next step, a silicon dioxide layer 28 is deposited on the resist features 26 of the patterned resist layer 24 to form a multilayer etch-resistant stack 10, as shown in FIGS. 1D and 1E. The multilayer stack 10 comprises resist features 26 that have a top surface 30 and sidewalls 32 and also have spacing gaps 34 between the resist features 26. The silicon dioxide layer 28 forms a continuous layer that covers the top surfaces 30 and sidewalls 32 of the resist features 26 and the spacing gaps 34 between the resist features 26 such that the ratio of a sidewall thickness (Ts) of the silicon dioxide layer to a top thickness (Tt) of the silicon dioxide layer is from about 0.95:1 to about 1:1 or even 1:1, and the ratio of Tt to the bottom thickness (Tb) of the silicon dioxide layer is also from about 0.95:1 to about 1:1, or even 1:1. The less than or about 5% difference in thickness between Tt and Ts and the less than 1% difference between Tt and Tb were excellent and unexpected results. The conformal silicon dioxide layer 28 continuously covered the resist features 26 with a layer having a thickness that deviates by less than 5%, or even less than 3%, across a substrate comprising a 300 mm silicon wafer. The conformal silicon dioxide layer 28 protects the shape and dimensions of the underlying resist features 26. This allows the patterned resist layer 24 to maintain more accurate dimensions, such as critical dimensions, during subsequent processes for etching through the layer 15 below the patterned resist layer 24 on the substrate 12. The layer 15 can be a layer of a dielectric, metal-containing, or semiconducting material, or even a portion of a display or wafer. The conformal silicon dioxide layer 28 protects the underlying resist layer 14, especially when the resist layer 14 comprises a polymeric material from burn-off or oxidation in subsequent deposition or etching processes.

In another exemplary embodiment, the silicon dioxide layer 28 is used in the fabrication of through-silicon vias (TSVs) in a substrate 12 comprising a silicon plate 25, as shown in FIGS. 2A to 2G. In one commonly used method of fabrication, the silicon plate 25 is mounted on a carrier 27, as shown, for example, in FIG. 2A. The silicon plate 25 can have various forms, such as a layer of silicon, e.g., a thin silicon wafer comprising monocrystalline silicon, a polycrystalline silicon layer deposited on the carrier 27, or other forms of crystalline or amorphous silicon. During the steps of fabricating the through-silicon vias (TSVs) 45, the silicon plate 25 is supported by the carrier 27 which can be, for example, a glass, polymer, ceramic, or semiconductor plate such as silicon wafer or one made from other materials. In one embodiment, the carrier 27 is a silicon wafer having a thickness of from about 400 to about 800 microns (e.g., about 700 microns), and the silicon plate 25 is a thinner silicon wafer having a thickness of from about 50 to about 500 microns (e.g., about 100 microns). An adhesive layer 29 bonds the silicon plate 25 to the carrier 27. A suitable adhesive layer 29 includes, for example, thermoplastic adhesive, e.g., a thermoplastic resin that is UV or heat curable. A suitable thermoplastic resin comprises a hydrocarbon polymer, such as BREWER™ fabricated by 3M Corp. Minnesota. Certain thermoplastic resins flow and cure at temperatures of less than about 350° C., such as, for example, 250° C., or even 200° C.

Figure 2A:
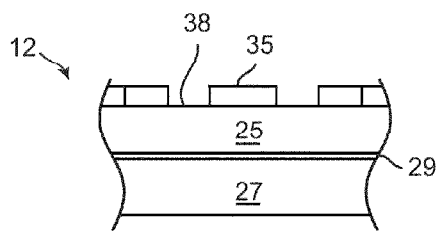
Figure 2B:
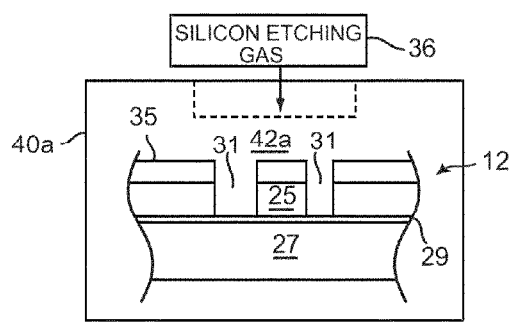

To fabricate the TSVs 45, a plurality of through holes 31 are etched through the silicon plate 25 after the silicon plate 25 is bonded to the glass carrier 27. Prior to the etching process, conventional resist and lithography processes are used to form a plurality of resist features 35 on the silicon plate 25, as shown in FIG. 2A. In the etching process, the substrate 12 comprising the silicon plate 25 with the overlying pattern of resist features 35 is placed in a process zone 42a and exposed to a silicon etching gas 36 to etch the exposed silicon surface 38 of the silicon plate 25 that are spaced apart and lie between the resist features 35, as shown in FIG. 2B. In one embodiment, the etchant gas comprises tetrafluoromethane ($CF_4$) and hexafluoropropylene ($C_3F_6$). A silicon etching plasma is sustained by applying a current at a frequency of 13.6 MHz to process electrodes about the process zone 42a at a power level of from about 100 watts to about 10,000 watts to etch the substrate 12.

The etching plasma etches the exposed silicon portions 38 to form a plurality of through holes 31 therein, as shown in FIG. 2B. Generally, the through holes 31 are substantially vertical and extend through most of the silicon plate 25 or even all of it. In one embodiment, the through holes 31 are etched to form holes with aspect ratios (the ratio of the height divided by the width of the feature) of at least about 10:1, or even from about 10:1 to about 15:1. In this embodiment, the through holes 31 had diameters of from about 4 microns to about 50 microns. After the etching process, conventional resist ashing and stripping processes are used to remove the residual resist material remaining on the substrate 12—for example, using an oxygen-containing plasma to ash the residual resist.

Figure 2C:
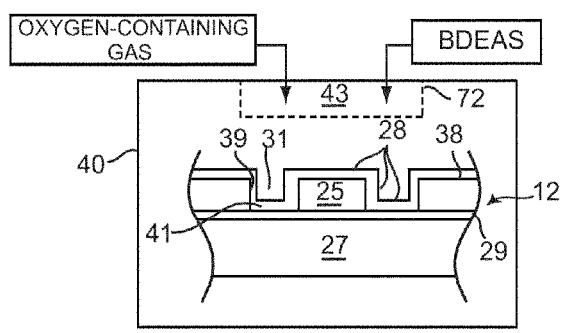

Thereafter, a silicon dioxide layer 28 is deposited in the through holes 31 to cover the sidewalls 39 and bottom walls 41 of the through holes 31 and the surface 38 of the silicon plate 25, as shown in FIG. 2C. During the deposition process, the chamber 40 is maintained at a pressure of from about 5 to about 200 Torr, or even from about 10 to 100 Torr. A deposition gas is introduced into the chamber 40, the deposition gas comprising BDEAS at a flow rate of from about 100 to about 5000 mgm or even from about 300 to about 3000 mgm, and an oxygen gas at a flow rate of from about 200 to about 20,000 sccm or even from about 2000 to about 12,000 sccm. The oxygen-containing gas can be, for example, $O_2$ or $O_3$ (ozone), or $O_2$ can be provided to form $O_3$ (ozone). The temperature can be maintained at or under 180° C. during deposition. Advantageously, the low process temperatures used in this deposition process can deposit a conformal silicon dioxide layer 28 into the through holes 31 at temperatures of less than 200° C., which is less than the reflow temperature of the adhesive used to bond the carrier 27 to silicon plate 25. Further, the present process allows deposition of a conformal silicon dioxide layer 28 which is difficult to do at low temperatures using conventional processes. The silicon dioxide layer 28 serves to electrically insulate the sidewalls 39 of the through holes 31.

Figure 2D:
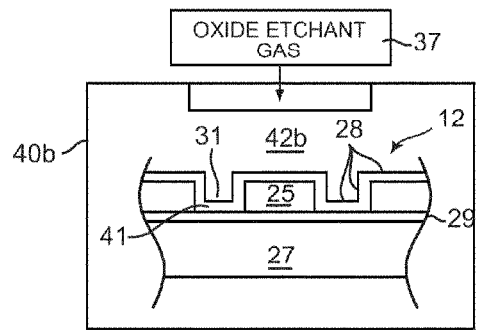

After deposition of the silicon dioxide layer 28, the substrate 12 is subjected to a reactive ion etching (RIE) process to etch away the silicon dioxide layer 28 formed on the bottom walls 41 of the through holes 31. In this process, the substrate 12 is placed in a process chamber 40b, and a conventional oxide etching process which uses a plasma of an oxide etchant gas 37, such as a fluorine-containing gas, is introduced into the process zone 42b of the chamber 40b to etch away the silicon dioxide layer 28 on the bottom walls 41 of the through holes 31, as shown in FIG. 2D.

Figure 2E:
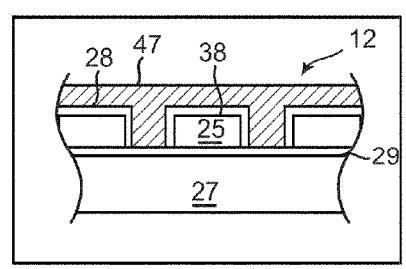

Thereafter, a metal deposition process is used to deposit a metal-containing material 47 into the through holes 31. In one embodiment, a conventional electrochemical process is used to electroplate metal into the through holes 31, as shown in FIG. 2E. In this process, the substrate 12 is immersed in an electroplating bath containing suitable metal-containing ions. The substrate 12 is charged, for example, as the cathode, and another electrode, such as an anode (not shown), is placed in the electroplating bath. The resultant current deposits metal ions in the through holes 31 to build up the metal-containing material 47. Prior to the electroplating process, a seed layer containing the same metal atoms as that of the metal-containing material 47 can be deposited by physical vapor deposition onto the surfaces of the through holes 31. In addition, a barrier layer can also be deposited to prevent the diffusion of metal ions, such as a layer of titanium or tantalum. Instead of the electroplating process, conventional metal deposition processes, such as physical vapor deposition, can also be used to deposit the metal-containing material 47 into the through holes 31. Suitable metal-containing materials 47 include aluminum, copper, gold, titanium, tungsten, and alloys and compounds thereof.

Figure 2F:
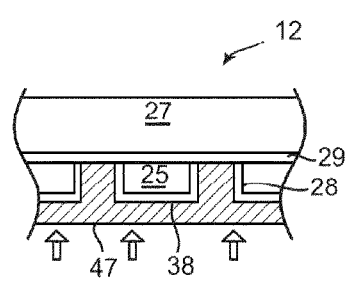
Figure 2G:
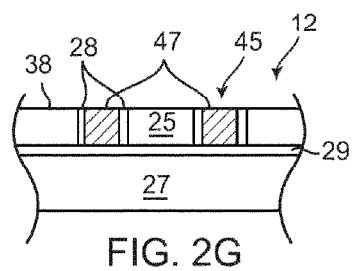

After deposition of the metal-containing material 47, the substrate 12 is flipped over, and conventional chemical mechanical polishing methods are used to polish off the excess metal-containing material 47 deposited on the surface 38 of the silicon plate 25, as shown in FIG. 2F. The chemical mechanical polishing step is conducted until all of the metal-containing material 47 is polished away. The polishing process can also be used to remove any residue of silicon dioxide layer 28 which still remains in the surface 38 of the silicon plate 25. As a result, the top portions of the metal-containing material 47 are now exposed to serve as contact points.

Figure 3A:
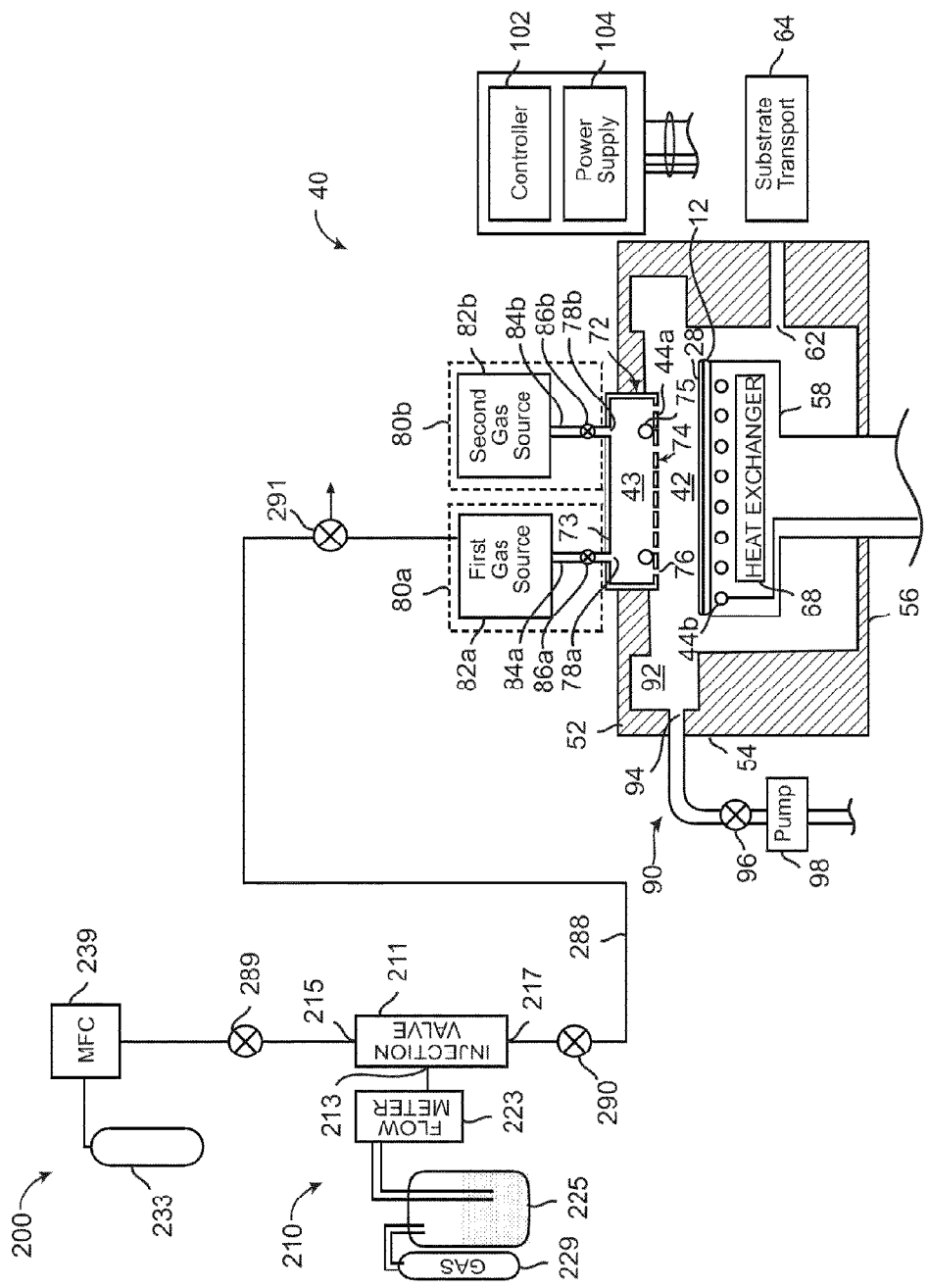
FIG. 3A is a schematic view of an embodiment of a substrate processing chamber that is a chemical vapor deposition process chamber.

The silicon dioxide layers 28 are deposited as a portion of the multilayer stack 10, or deposited onto the sidewalls 39, the TSVs 45 using a thermal CVD process. An embodiment of a substrate process chamber 40 that can be used to deposit the silicon dioxide layer 28 by a thermal CVD is illustrated in FIG. 3A. The chamber 40 is provided as an exemplary chamber; however, other chambers may also be used as would be apparent to one of ordinary skill in the art. Accordingly, the scope of the invention should not be limited to the exemplary chamber described herein.

In the deposition method, a process gas comprising BDEAS (which is Bis(diethylamino) silane and can have the formula $SiH_2(NC_2H_5)_2$) is advantageously used as a source of silicon for the silicon dioxide layer 28. Theoretical simulations and experiments were used to select the BDEAS as a precursor gas in conjunction with an oxygen-containing gas. The unique aspect of this precursor is to allow deposition of a silicon dioxide layer 28 without generating excessive amounts of reactive radicals or ions that damage the resist features 26 of the patterned resist layer 24 or the adhesive layer 29, or other room temperature materials on the substrate 12. The theoretical simulation models predicted that the BDEAS precursor can be oxidized by either $O^-$ radicals or $O_3$ radicals with a negative heat of formation at relatively low temperatures without necessitating formation of a direct or remote plasma during the deposition process. The possible oxidation reaction paths of BDEAS with a reaction barrier calculation are as follows:

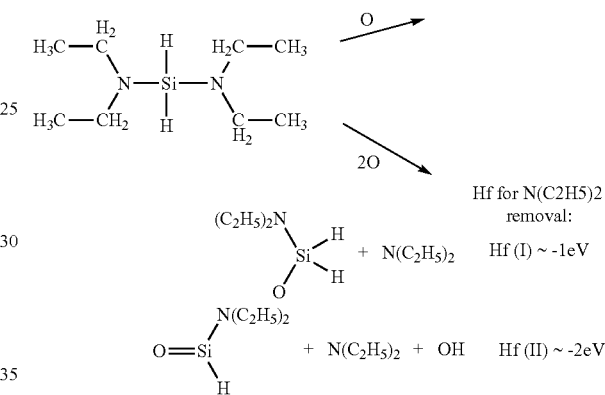

In this process, the substrate 12 with the patterned resist layer 24 or through-holes 31 for the TSVs 45 is placed in a process zone 42 of a process chamber 40. A process gas comprising BDEAS and an oxygen-containing gas is provided in the process zone 42 to deposit a silicon oxide on a substrate 12. The liquid BDEAS can be provided to the process chamber 40 by different methods. In one method, a gas delivery system 200 comprising BDEAS liquid vaporizer 210 and an injection valve 211 is used to provide the BDEAS in a liquid form transported through a gas line 288 by a carrier gas to the process chamber 40. The liquid vaporizer 210 comprises an injection valve 211 coupled to a liquid BDEAS source 225 via a liquid flow meter 223. The liquid BDEAS source 225 is coupled to a respective pressurized gas source 229, such as a helium source, which is used to push out and deliver liquid BDEAS to the injection valve 211. A separate carrier gas source 233 supplies carrier gas to the injection valve 211 with the flow rate of the carrier gas being controlled by a mass flow controller 239, which in turn is connected to and controlled by the system controller allowing for control over the mass flow controller 239 and for monitoring of the temperature of the mass flow controller 239 for clog-detection purposes.

In operation, an inert carrier gas such as helium flows from the carrier gas source 233 to vaporize the processing liquid provided in the vaporizer 210. Flow into and out of vaporizer 210 is controlled by valves 289, 290 that are positioned on the gas delivery lines 288 both upstream and downstream of the vaporizers 210. Specifically, an upstream shut-off valve 289 controls the flow of carrier gas through the gas line 288 to the vaporizer 210. A final valve 290 is positioned downstream from vaporizer 210 and before the outlet of the delivery line 288 can be used to govern the flow of the carrier gas/vaporized liquid mixture from the vaporizer 210 to the gas distributor 72 of the process chamber 40. The flow rate of carrier gas from the gas source 233 is set to a desired flow rate using mass flow controller 239.

Figure 3B:
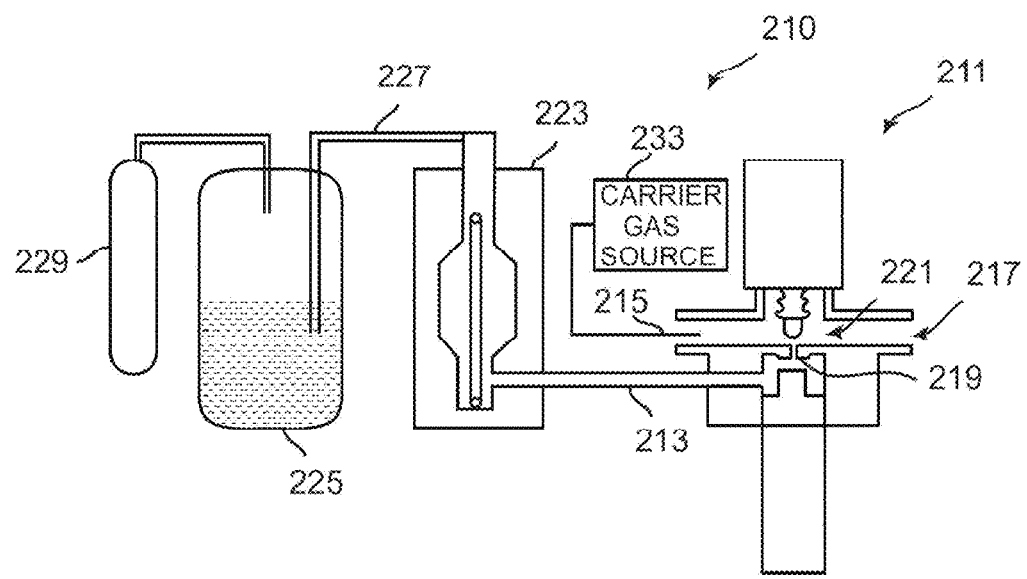
FIG. 3B is a diagrammatic side elevation view of an embodiment of a gas delivery system comprising a vaporizer for the chamber of FIG. 2A.

The processing liquid is vaporized in the vaporizer 210, as described with reference to FIGS. 3A-3B, causing a mixture of vaporized BDEAS and helium to flow from outlet 217 of the injection valve 211 through the final valve 290 and divert valve 291 to the process chamber 40. The vaporizer 210 comprises a conventional injection valve 211 having a processing liquid inlet 213 for inputting a processing liquid, such as BDEAS liquid, a carrier gas inlet 215 for inputting an inert carrier gas, and an outlet 217 for outputting a vaporized processing liquid/carrier gas mixture. Within each injection valve 211, the processing liquid inlet 213 terminates at an orifice 219 leading to a central region 221 where the processing liquid inlet 213, the carrier gas inlet 215, and the outlet 217 meet. The injection valve 211 is configured such that the relative sizes of the orifice 219 and the central region 221, and the pressures, flow rates, and relative direction of the processing liquid and carrier gas flow, cause a pressure drop within the area of the central region 221, as is conventionally known in the art. This pressure drop causes processing liquid supplied to the processing liquid inlet 213 to vaporize as it passes from the processing liquid inlet 213, through the orifice 219 to the central region 221. The processing liquid inlet 213 is coupled to a liquid flow meter (LFM) 223 which controls the flow rate of processing liquid traveling to the injection valve 211. The liquid flow meter 223 also is coupled via line 227 to a liquid BDEAS source 225 within the vaporizer 210, which in turn is coupled to a pressurized gas source 229, such as a canister of pressurized helium.

In operation, the pressurized helium flow forces the processing liquid from the processing liquid BDEAS source 225 through line 227 to the liquid flow meter 223. The liquid flow meter 223 controls the flow rate of the processing liquid as it travels from liquid flow meter 223 through the processing liquid inlet 213 and the orifice 219 to the central region 221 of the injection valve 211. A pressurized carrier gas from a carrier gas source 233, such as helium, flows through the carrier gas inlet 215 into the central region 221. The processing liquid vaporizes and mixes with the carrier gas as the processing liquid enters the central region 221 due to the pressure decrease experienced as the processing liquid travels from the orifice 219 to the central region 221. The combined vaporized processing liquid/carrier gas flows from injection valve 211 via outlet 217 to the process chamber 40.

Figure 3C:
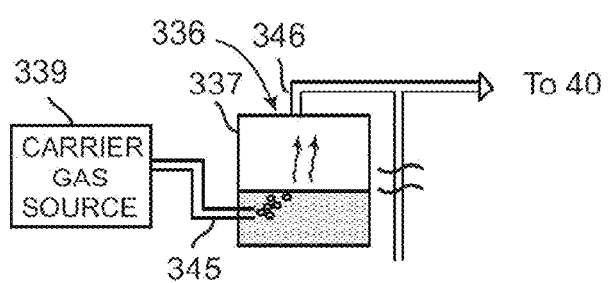
FIG. 3C is a diagrammatic side elevation view of a gas delivery system comprising a bubbler for the chamber of FIG. 2A.

In another method, the BDEAS is provided by bubbling a carrier gas through a bubbler 336 comprising liquid BDEAS and flowing the carrier gas with the DBEAS vapor transported by the same to the process chamber 40, as shown in FIG. 3C. A carrier gas is bubbled through a bubbler 336 to transport liquid in the form of vaporized BDEAS to the gas distributor 72 of the process chamber 40. The bubbler 336 comprises a container 337 capable of holding liquid BDEAS, an inlet tube 345 for the carrier gas source 339 which is provided as a pressurized gas from a carrier gas source 339, and outlet tube 346 to release the carrier gas with the transported BDEAS. A suitable carrier gas source 339 comprises a canister of compressed helium or a mixture of helium and other gases, such as argon. When bubbled through the bubbler 336, the carrier gas transports vaporized BDEAS or even a portion of the liquid precursor to the chamber 40. A suitable mass flow rate for the BDEAS is from about 200 to about 2000 mb/min, or even from about 500 to about 1000 mg/min. Suitable carrier gases include inert gases or gases which are non-reactive with the BDEAS. In one version, the carrier gas transports liquid precursor to a mixing zone 43 above the process zone 42 where it is heated and vaporized, as shown in FIG. 3A. To generate such a flow rate of the BDEAS, the carrier gas is bubbled through the bubbler 336 at a flow rate of from about 100 to about 5000 mgm, or even from about 500 to about 3000 sccm.

Different types of oxygen-containing gases can be used in the deposition process. For example, the oxygen-containing gas can include ozone, oxygen, or mixtures thereof. A suitable flow rate for the oxygen-containing gas is from about 200 to about 20,000 sccm, or even from about 2000 to about 10,000 sccm. In one version, the oxygen-containing gas comprises ozone. Advantageously, the ozone gas does not generate oxygen radicals, such as $O^{-2}$, and consequently, does not contribute to oxidation and erosion of resist layers 14, such as the photoresist layers 16. The ozone generates $O^{-3}$ radicals which are substantially less reactive with the photoresist layers 16 than the radicals generated from oxygen gas or plasma. The ozone can be generated by passing an oxygen-containing gas, such as oxygen, through an ozone generator. A suitable ozone generator comprises an ozonator, such as a MKS 8403 available from MKS, MKS Instruments, Andover, Mass. When the ozone is used, the volumetric flow rate for the ozone is the same as that of the oxygen-containing gas used to make the ozone, which is from about 200 to about 20,000 sccm. In one version, a suitable ratio of BDEAS to oxygen-containing gas, such as ozone, is from about 0.005:1 to about 50:1, or even from about 0.05:1 to about 15:1. This ratio controls the stoichiometry of the deposited silicon dioxide layer 28, which can be in the stoichiometric ratio of $SiO_2$ or other ratios such as $Si_xO_y$. The ratio also controls the amount of carbon that is co-deposited into the silicon dioxide layer 28.

A gas distributor 72 comprising a mixing zone 43 can be used to mix the BDEAS and oxygen-containing gas. In this version, the BDEAS and oxygen-containing gases are introduced through separate flow paths so that the gases mix in the mixing zone 43 immediately above the process zone 42. The mixing zone 43 prevents the undesirable reaction of these gases prior to their introduction into the process zone 42. The mixing zone 43 also allows mixing of the process gases at a predefined temperature by controlling the temperature of the mixing zone 43. In one version, the mixing zone 43 is maintained at a temperature of at least about 90° C., or even about at least about 120° C. This temperature achieved by actively heating the mixing zone using a heater, such as a resistance electrical heater, lamps, or other heaters.

During the deposition process, the substrate 12 can be maintained at relatively low temperature to promote the reaction between the BDEAS and the oxygen-containing gas to deposit a silicon dioxide layer 28 on the substrate 12. In one version, the substrate 12 is maintained at a temperature that is sufficiently low not to damage the resist layer 14 on the substrate 12, especially when the resist layer 14 is a polymeric photoresist layer. Sufficiently low temperatures are less than 70° C., or even less than 50° C. However, if the resist layer 14 is sensitive to heat, the BDEAS deposition process can even be performed at even lower temperatures (e.g., at room temperature). Advantageously, the heat or temperature assisted reaction promotes gas phase reaction without the use of any plasma to avoid the possible damage to photoresist layer 16.

The gas pressure in the process zone 42 is maintained at from about 1 to about 60 Torr, or even from about 2 to about 10 Torr or even about 4 Torr. The gas pressure can be controlled by a gas exhaust 90 comprising a throttle valve and exhaust pumps such as roughing and turbomolecular pumps.

Referring now to FIG. 3A, generally, the chamber 40 is a chemical vapor deposition chamber suitable for processing a substrate 12 such as a silicon wafer, a suitable chamber being a Producer® SE type chamber from Applied Materials, Santa Clara, Calif. The chamber 40 comprises enclosure walls 48, which include a ceiling 52, sidewalls 54, and a bottom wall 56, that enclose a process zone 42. The chamber 40 may also comprise a liner (not shown) that lines at least a portion of the enclosure walls 48 about the process zone 42. For processing a 300 mm silicon wafer, the chamber typically has a volume of about 20,000 to about 30,000 $cm^3$, and more typically, about 24,000 $cm^3$.

During a process cycle, a substrate support 58 is lowered and a substrate 12 is passed through an inlet port 62 and placed on the support 58 by a substrate transport 64, such as a robot arm. The substrate support 58 can be moved between a lower position for loading and unloading, and an adjustable upper position for processing of the substrate 12. The substrate support 58 can include an enclosed electrode 44a to generate a plasma from process gas introduced into the chamber 40. The substrate support 58 can also be cooled or heated to maintain the desired temperatures by a heat exchanger 68 which can be a fluid circulating heat exchanger, heater, heating lamp, chiller, or the substrate temperature can be maintained by the plasma itself. For example, the heat exchanger 68 can be adapted to maintain the substrate 12 on the substrate support at temperatures of less than 200° C. The substrate 12 can also be heated by raising the substrate to be close to the faceplate 74 of the gas distributor 72. The substrate support 58 typically comprises a ceramic and/or metal structure which has a receiving surface to receive the substrate 12 and which protects the electrode 44a from the chamber environment. In use, a radio frequency (RF) voltage is applied to the electrode 44a and a direct current (DC) voltage is applied to the heat exchanger 68. The electrode 44a in the substrate support 58 can also be used to electrostatically clamp the substrate 12 to the support 58. The substrate support 58 may also comprise one or more rings (not shown) that at least partially surround a periphery of the substrate 12 on the support 58.

After a substrate 12 is loaded onto the substrate support 58, the support 58 is raised to a processing position that is closer to a faceplate 74 of a gas distributor 72 to provide a desired spacing gap distance, $d_s$, therebetween. The spacing distance can be from about 2 mm to about 50 mm. The faceplate 74 of the gas distributor 72 is located above the process zone 42 for dispersing a process gas uniformly across the substrate 12. The gas distributor 72 also includes a gas manifold 73 that can separately deliver two independent streams of first and second process gas to a mixing zone 43 without mixing the gas streams prior to their introduction to the mixing zone 43. For example, a first gas stream can deliver a silicon-containing precursor gas, such as BDEAS, and the second gas stream can deliver an oxygen-precursor gas, such as ozone. This allows the silicon-containing precursor gas such as the BDEAS to have a separate flow path from the oxygen-containing gas to avoid pre-mixing the gases until they reach the mixing zone 43 and/or process zone 42 of the chamber 40. The faceplate 74 has gas holes 76 that allow the passage of process gas therethrough. The faceplate 74 is typically made of metal to allow the application of a voltage or potential thereto and thereby serve as electrode 44a in the chamber 40. A suitable faceplate 74 can be made of aluminum with an anodized coating.

The substrate processing chamber 40 also comprises first and second gas supplies 80a,b to deliver the first and second process gas to the gas distributor 72, the gas supplies 80a,b each comprising a gas source 82a,b, one or more gas conduits 84a,b, and one or more gas valves 86a,b. For example, in one version, the first gas supply 80a comprises a first gas conduit 84a and a first gas valve 86a to deliver a first process gas from the gas source 82a to a first inlet 78a of the gas distributor 72, and the second gas supply 80b comprises a second gas conduit 84b and a second gas valve 86b to deliver a second process gas from the second gas source 82b to a second inlet 78b of the gas distributor 72. In one version, the first gas supply 80a can include a first gas source 82a comprising a source of BDEAS, and the second gas supply 80b can include a second gas source 82b comprising a source of ozone. The BDEAS can be supplied by the liquid vaporizer 210 or bubbler 336 as previously described. When BDEAS is used as the silicon-containing gas, the faceplate 74 of the gas distributor 72 can also include a heater 75 to heat the faceplate 74 of the gas distributor 72 to a temperature sufficiently high to promote the gas phase reaction of the precursor. The heater 75 can be a resistance electrical heater, lamp, fluid heat exchanger, or other heaters. A suitable temperature comprises at least about 120° C., or even at least about 140° C., such as for example about 160° C.

Optionally, the process gas can be energized by coupling electromagnetic energy (e.g., high frequency voltage energy) to the process gas to form a plasma from the process gas. However, in some applications, it is preferred not to energize the process gas, especially when the process gas comprises BDEAS or when the resist layer is a polymeric resist which can become oxidized by oxygen-containing plasma ions. To energize the process gas, a voltage is applied between (i) a first electrode 44a, which may be the gas distributor 72, ceiling 52, or chamber sidewall 54, and (ii) the electrode 44b in the support 58. The voltage applied across the pair of electrodes 44a,b capacitively couples energy to the process gas in the process zone 42. Typically, the voltage applied to the electrodes 44a,b is an alternating voltage which oscillates at a radio frequency. Generally, radio frequencies cover the range of from about 3 kHz to about 300 GHz. For the purposes of the present application, low radio frequencies are those which are less than about 1 MHz, and more preferably from about 100 KHz to 1 MHz (e.g., a frequency of about 300 KHz). Also for the purposes of the present application, high radio frequencies are those from about 3 MHz to about 60 MHz, and more preferably about 13.56 MHz. The selected radio frequency voltage is applied to the first electrode 44a at a power level of from about 10 W to about 1000 W, and the second electrode 44b is typically grounded. However, the particular radio frequency range that is used and the power level of the applied voltage depend on the type of material to be deposited.

The chamber 40 also comprises a gas exhaust 90 to remove spent process gas and byproducts from the chamber 40 and maintain a predetermined pressure of process gas in the process zone 42. In one version, the gas exhaust 90 includes a pumping channel 92 that receives spent process gas from the process zone 42, an exhaust port 94, a throttle valve 96, and one or more exhaust pumps 98 to control the pressure of process gas in the chamber 40. The exhaust pumps 98 may include one or more of a turbo-molecular pump, cryogenic pump, roughing pump, and combination-function pumps that have more than one function. The chamber 40 may also comprise an inlet port or tube (not shown) through the bottom wall 56 of the chamber 40 to deliver a purging gas into the chamber 40. The purging gas typically flows upward from the inlet port past the substrate support 58 and to an annular pumping channel. The purging gas is used to protect surfaces of the substrate support 58 and other chamber components from undesired deposition during the processing. The purging gas may also be used to affect the flow of process gas in a desirable manner.

A controller 102 is also provided to control the operation and operating parameters of the chamber 40. The controller 102 may comprise, for example, a processor and memory. The processor executes chamber control software, such as a computer program stored in the memory. The memory may be a hard disk drive, read-only memory, flash memory, or other types of memory. The controller 102 may also comprise other components, such as a floppy disk drive and a card rack. The card rack may contain a single-board computer, analog and digital input/output boards, interface boards and stepper motor controller boards. The chamber control software includes sets of instructions that dictate the timing, mixture of gases, chamber pressure, chamber temperature, microwave power levels, high frequency power levels, support position, and other parameters of a particular process.

The chamber 40 also comprises a power supply 104 to deliver power to various chamber components, such as the first electrode 44a in the substrate support 58 and the second electrode 44b in the chamber. To deliver power to the chamber electrodes 44a,b, the power supply 104 comprises a radio frequency voltage source that provides a voltage having the selected radio frequencies and the desired selectable power levels. The power supply 104 can include a single radio frequency voltage source or multiple voltage sources that provide both high and low radio frequencies. The power supply 104 can also include an RF matching circuit. The power supply 104 can further comprise an electrostatic charging source to provide an electrostatic charge to an electrode, which is often an electrostatic chuck, in the substrate support 58. When a heat exchanger 68 is used within the substrate support 58, the power supply 104 also includes a heater power source that provides an appropriate controllable voltage to the heat exchanger 68. When a DC bias is to be applied to the gas distributor 72 or the substrate support 58, the power supply 104 also includes a DC bias voltage source that is connected to a conducting metal portion of the faceplate 74 of the gas distributor 72. The power supply 104 can also include the source of power for other chamber components—for example, motors and robots of the chamber 40.

The substrate processing chamber 40 also comprises a temperature sensor (not shown) such as a thermocouple or an interferometer to detect the temperature of surfaces, such as component surfaces or substrate 12 surfaces, within the chamber 40. The temperature sensor is capable of relaying its data to the chamber controller 102 which can then use the temperature data to control the temperature of the processing chamber 40—for example, by controlling the resistive heating element in the substrate support 58.

EXAMPLES

The following illustrative examples demonstrate the effectiveness and advantages of silicon dioxide layers 28 deposited according to the present method. The silicon dioxide layer 28 was deposited as part of a multilayer etch-resistant stack 10 on a substrate 12, and also as an oxide liner in TSV features 45 formed in a silicon plate 25. The structure and methods described herein will become better understood with regard to these illustrative examples. However, it should be understood that each of the features described herein can be used by itself or in any combination, and not merely as described in a particular example. Thus, the illustrative examples provided herein should not be used to limit the scope of the present invention.

Example 1

Multilayer Stack

With respect to the multilayer stack examples, a layer 15 of an anti-reflective coating was initially deposited on some of the substrates 12. For some of these experiments, an overlying blanket resist layer 14 comprising a photoresist layer 16 in a thickness of about 193 nm, such as EPIC 2135 photoresist, was formed on the substrate 12. Optionally, resist features 26 were made from the resist layer 14 with conventional lithography processes. Thereafter, in certain examples, a conformal silicon oxide layer 28 was deposited over the resist features 26 using a process gas comprising BDEAS and ozone and with the following process conditions: BDEAS generated by a liquid vaporizer at a flow rate of 2000 mgm with a carrier gas flow rate of 4000 sccm; ozone flow rate of 10,000 sccm; process gas pressure 4 Torr; substrate temperature 70° C.; and faceplate temperature of 160° C.

Figure 4:
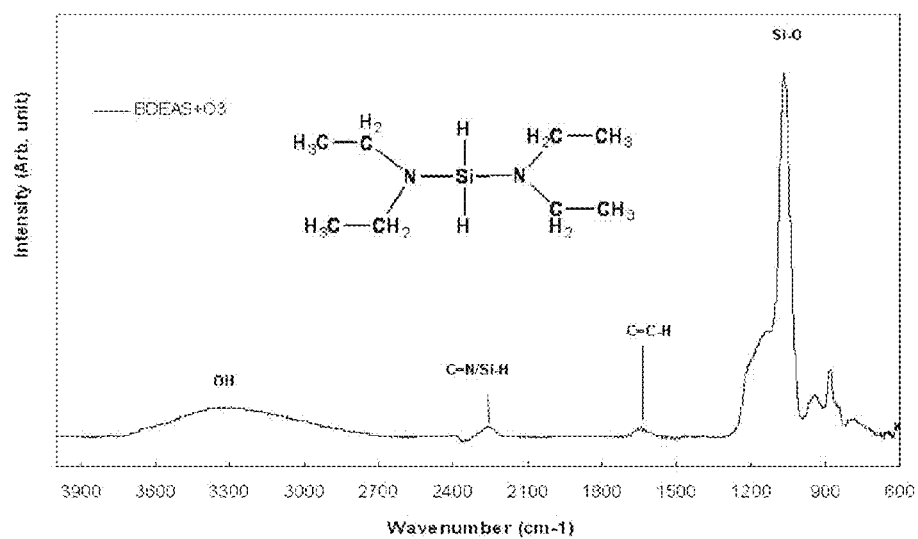
FIG. 4 is a graph of a Fourier-Transformed Infrared (FTIR) spectrum of a silicon dioxide layer deposited using BDEAS and ozone.

The Fourier-transformed infrared (FTIR) spectrum of a silicon dioxide layer 28 deposited as described above is shown in FIG. 4. As seen from the graph, the Si—O signal peak is well defined and was detected with a low intensity of a Si—OH peak. It is believed that the presence of Si—OH in the deposited silicon oxide layer 28 can be reduced by lowering the deposition pressure. Further, it was found that the silicon dioxide layer 28 that was deposited was more conformal to the underlying photoresist layer 16 when the Si—OH content in the deposited layer was lower, e.g., with a Si—OH to Si—O ratio of less than 10% (arbitrary FTIR Intensity units). The more conformal silicon oxide layer 28 closely followed the shape of the resist features 26 and covered the top surface 30 and sidewalls 32 of the features with a uniform thickness of silicon dioxide. Higher Si—OH content in the deposited silicon dioxide gas rose to a deposited layer that was more flowable, by which it is meant that the layer did not cover the top surface 30, sidewalls 32, and spacing gaps 34 in a uniform manner, but instead, filled the spacing gaps 34 with a thicker layer while covering the top surface 30 and sidewalls 32 with a thinner layer of silicon dioxide. It was further determined that the small amounts of carbon detected in the FTIR Spectrum could be removed by a post-deposition plasma treatment. Also, the rate of deposition of the silicon dioxide layer 28 was tunable by changing process parameters such as the process gas pressure and faceplate temperature. Maintaining the substrate 12 at a substrate temperature that is lower than 70° C. (e.g., by using a lower temperature heat exchanger) can also provide lower deposition rates.

Figure 5:
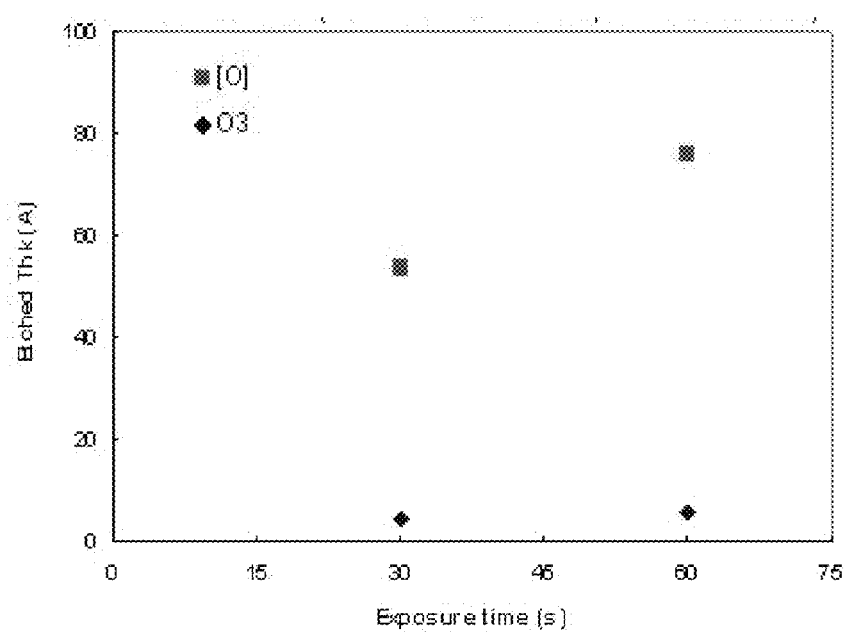
FIG. 5 is a graph of the thickness of a blanket photoresist layer on a substrate that is etched away in a remote plasma-generated oxygen process and in an ozone process.

The effect of different oxidative environments on a resist layer 14 comprising a blanket photoresist layer 16 was determined by exposing a blanket photoresist layer 16 on a substrate 12 to different oxidation environments. The substrate 12 was maintained at a temperature of 70° C., and the thickness of the blanket photoresist layer 16 on the substrate 12 that was etched away in the oxidation process was measured, as shown in FIG. 5. The oxidation environment was simulated under the same process conditions as an actual deposition process; however, BDEAS was not introduced into the process zone 42. In the first experiment, an oxygen-containing gas, such as $O_2$ or $N_2O$, was activated or energized by a remote plasma source in a remote zone by microwave energy, then introduced into the process zone 42 to provide remotely energized oxygen ions in the process zone 42. In the second experiment, ozone gas generated by an ozone generator such as the MKS 4803 generator was introduced into the process zone 42, and no plasma was formed from the ozone gas. These experiments were performed to estimate the quantitative effect of an oxidation environment on the photoresist layer 16 without causing deposition of silicon dioxide due to the presence of BDEAS. The oxygen radical provided by the remote plasma source was found to cause a substantial amount of etching of the photoresist layer 16, while there was substantially no etching or damage to the photoresist layer 16 by the ozone. This experiment confirmed the desirability of using ozone as an oxidation gas for depositing an oxide layer.

Figure 6A:
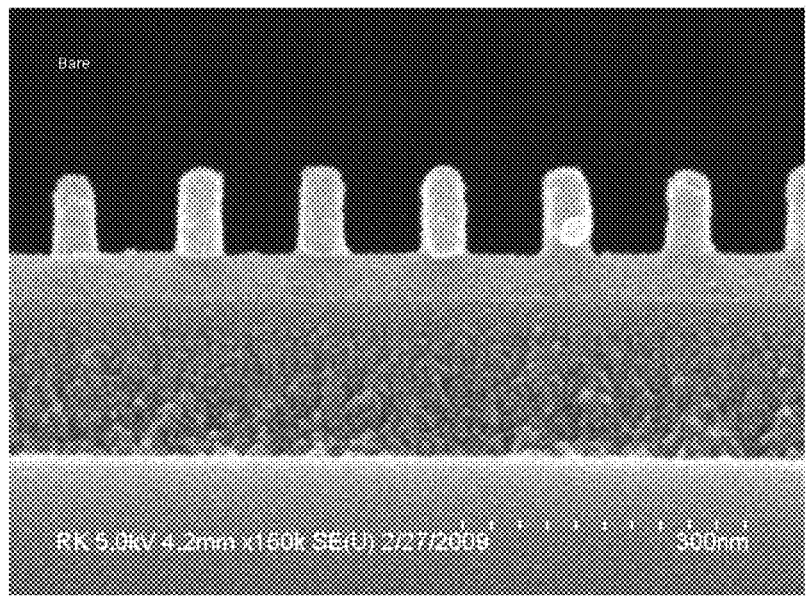
FIG. 6A is a scanning electron micrograph showing the cross-sectional shape of resist features formed in a lithographic process.
Figure 6B:
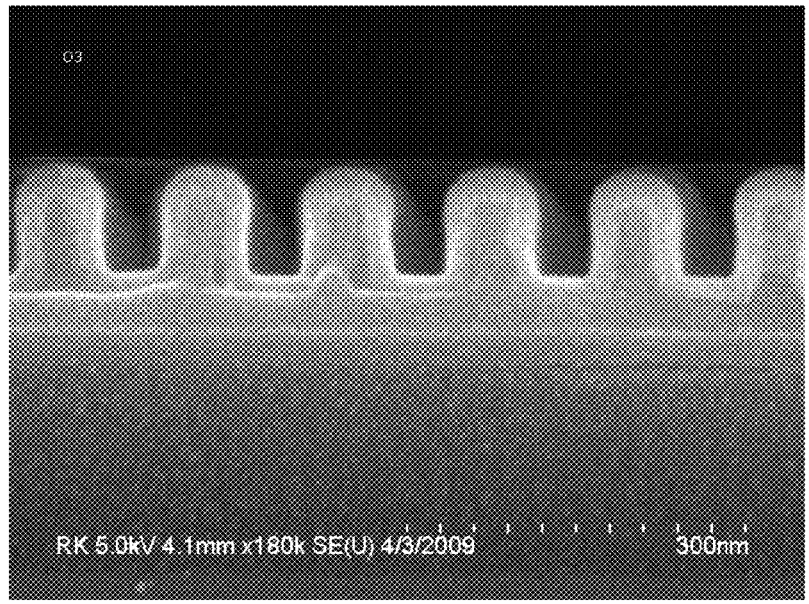
FIG. 6B is a scanning electron micrograph of a conformal silicon dioxide layer deposited over the resist features.

The advantages of the deposition process which uses BDEAS and oxygen-containing gas to deposit the silicon dioxide layer 28 at low temperatures, even at temperatures below 90° C., are apparent from micrographs of the deposited silicon dioxide layer 28. A scanning electron microscope micrograph of the cross-sectional shape of the resist features 26 of the photoresist layer 16 before the deposition process is shown in FIG. 6A. The BDEAS-derived silicon dioxide layer 28 deposited on such a photoresist layer 16 is shown in FIG. 6B. It is seen that the deposited silicon dioxide layer 28 shows good step coverage and followed the contour profile of the top surface 30 and sidewalls 32 of the resist features 26 without eroding or otherwise damaging the resist features 26.

Figure 7:
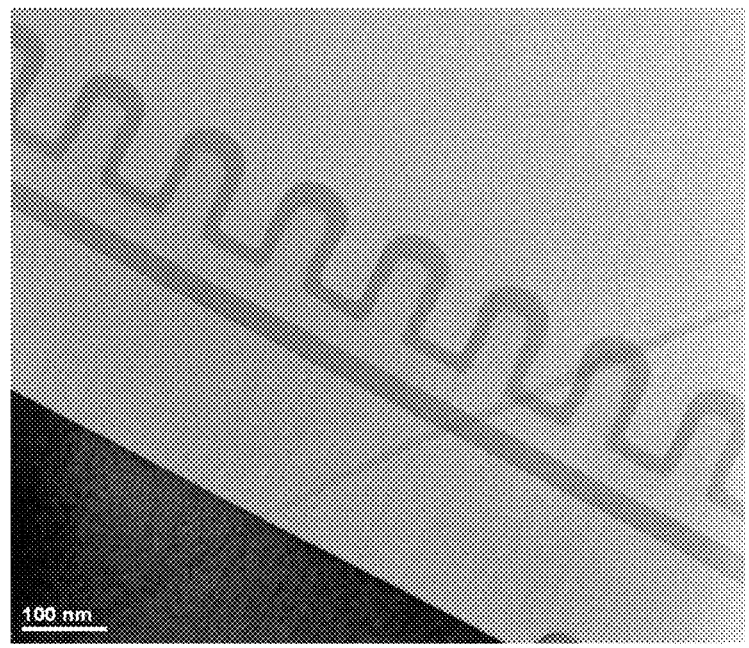
FIG. 7 is a transmission electron micrograph of a silicon dioxide layer deposited over the resist features.

A transmission electron micrograph of the same silicon dioxide layer 28 showing the uniform thickness of silicon dioxide that covered the resist features 26 is shown in FIG. 7. The photo also shows that the deposited silicon dioxide layer 28 was conformal to the features 26 and did not damage the photoresist material of the features 26. From these micrographs, it was determined that the conformal silicon dioxide layer 28 continuously covers the resist features 26 to form a layer with a uniform thickness. For example, the deposited silicon dioxide layer 28 was sufficiently conformal to have a ratio of the sidewall thickness (Ts) of the layer to top thickness (Tt) (as shown in FIG. 1E) but, measured from the photo of FIG. 6, was in the range of from about 0.95:1 to about 1:1, or even 1:1; also, the ratio of Tt to the bottom thickness (Tb) was in the range of from about 0.95:1 to about 1:1, or even 1:1.

This data demonstrates that a deposition reaction using BDEAS, which can be conducted at low temperatures less than 70° C., promotes gas phase reaction and deposition of silicon dioxide. By not using a plasma, oxidation damage to the photoresist layer 16 was avoided even in the presence of oxygen ions in the form of ozone. Further, the BDEAS-based process provided good step coverage and conformal layers of silicon dioxide, and parameters such as deposition rate were easily selectable to provide specific targets. This process also deposited oxide films temperatures below 70° C., and this allows its use for many lithography-related applications, such as lithographic processes to reduce shrinkage of critical dimensions of the resist features and etched features and to enable double patterning.

Example 2

Through-Silicon Via

In another example, a conformal silicon oxide layer was deposited inside through holes of TSVs which are being formed in a silicon plate. A deposition gas comprising BDEAS and ozone was used with the following process conditions: BDEAS generated by a liquid vaporizer at a flow rate of 2000 mgm with a helium carrier gas flow rate of 4000 sccm; ozone provided at a flow rate of 10,000 sccm; deposition gas pressure at 4 Torr; and the substrate maintained at a temperature of 180° C.

SEM micrographs of a cross section of a through hole of a TSV feature (or features), etched through a silicon wafer and having a silicon dioxide liner deposited using the BDEAS-based process, are shown in FIG. 8. The through holes had high aspect ratios of about 11, with a height of about 100 microns and a diameter of about 9 microns. As seen, the silicon dioxide layer provided good coverage of the sidewalls, bottom walls and bottom corners of the though holes, even for high aspect ratio holes of at least about 10:1. The BDEAS-deposited silicon dioxide layer exhibited a percent in-film uniformity at 1 sigma standard deviation of 1. Defects sized less than 0.16 microns were counted and found to be less than 30. The refractive index and refractive index range was 1.45±0.01. The deposition rate was good at 550 angstroms/min.

In contrast, FIG. 9 shows SEM micrographs of a cross section of a TSV feature comprising a conventional silicon dioxide layer deposited by a plasma-enhanced chemical vapor deposition (PECVD) process. The micrographs are of the middle and bottom portions of a through hole, as labeled.

The present process also generated unexpected and surprising results. For example, when comparing the sidewall coverage (defined by the ratio of sidewall thickness to the top thickness) of the BDEAS-deposited silicon dioxide layer from FIG. 8 to the same for the PECVD silicon dioxide layer in FIG. 9, the coverage at sidewall thickness of the through hole by the BDEAS-deposited layer was found to be consistently better than that of PECVD silicon dioxide. For example, at the sidewall bottom corner, BDEAS step coverage is 46% whereas the PECVD silicon dioxide layer is only 3%. Table I presents these results and others to demonstrate the surprisingly better properties of the BDEAS-derived silicon dioxide layer.

TABLE I

| Via structure | BDEAS Silicon Dioxide Layer | | PECVD Silicon Dioxide Layer | |
|---|---|---|---|---|
| (open, depth) Position in via | Thickness (nm) | Step Coverage % | Thickness (nm) | Step Coverage % |
| Top | 600 | 100 | 2780 | 100 |
| Top Side (at via Mouth) | 573 | 96 | 2075 | 75 |
| Sidewall Middle | 450 | 75 | 172 | 6 |
| Sidewall Bottom Corner | 276 | 46 | 87 | 3 |
| Sidewall Bottom | 300 | 50 | 86 | 3 |

Although exemplary embodiments of the present invention are shown and described, those of ordinary skill in the art may devise other embodiments which incorporate the present invention and which are also within the scope of the present invention. Furthermore, the terms "below", "above", "bottom", "top", "up", "down", "first" and "second" and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of forming a multilayer etch-resistant stack on a substrate, the method comprising:

(a) forming on the substrate, a patterned resist layer having a plurality of resist features that are spaced apart from one another; and
(b) depositing a silicon dioxide layer on the resist features of the patterned resist layer without forming a direct plasma or a remote plasma by:
 (i) placing the substrate with the patterned resist layer in a process zone;
 (ii) introducing into the process zone, a process gas comprising BDEAS and an oxygen-containing gas.

2. A method according to claim 1 wherein the resist features comprise top surfaces, sidewalls, and spacing gaps therebetween, and wherein (b) comprises depositing a silicon dioxide layer that covers the top surfaces and sidewalls of the resist features.

3. A method according to claim 2 wherein (b) comprises depositing a silicon dioxide layer that covers the top surfaces and sidewalls of the resist features such that the ratio of a sidewall thickness (Ts) of the silicon dioxide layer to a top thickness (Tt) of the silicon dioxide layer is from about 0.95:1 to about 1:1.

4. A method according to claim 1 wherein (b) comprises maintaining the substrate at a temperature of less than 70° C.

5. A method according to claim 1 wherein (b) comprises maintaining the substrate at about room temperature.

6. A method according to claim 1 wherein the oxygen-containing gas comprises ozone.

7. A method according to claim 6 comprising generating the ozone by passing oxygen through an ozone generator.

8. A method according to claim 1 comprising generating the BDEAS by flowing carrier gas through a vaporizer to vaporize liquid BDEAS.

9. A method according to claim 1 comprising introducing the BDEAS and oxygen-containing gases through separate gas conduits so that the gases mix in a mixing zone immediately above the process zone.

10. A method according to claim 9 comprising maintaining the mixing zone at a temperature of at least 90° C.

11. A method according to claim 1 wherein (a) comprises forming a resist layer comprising photoresist, exposing the photoresist layer to a pattern of light, and developing the exposed photoresist layer.

12. A method of forming a multilayer etch-resistant stack on a substrate, the method comprising:
(a) forming on the substrate, a patterned resist layer having a plurality of resist features that are spaced apart from one another;
(b) depositing a silicon dioxide layer on the patterned resist layer without forming a plasma by:
 (i) placing the substrate with the patterned resist layer in a process zone; and
 (ii) introducing into the process zone, a process gas comprising BDEAS and an oxygen-containing gas comprising ozone.

13. A method according to claim 12 wherein the resist features comprise top surfaces, sidewalls, and spacing gaps therebetween, and wherein (b) comprises depositing a silicon dioxide layer that covers the top surfaces and sidewalls of the resist features.

14. A method according to claim 13 wherein (b) comprises depositing a silicon dioxide layer that covers the top surfaces and sidewalls of the resist features such that the ratio of a sidewall thickness (Ts) of the silicon dioxide layer to a top thickness (Tt) of the silicon dioxide layer is from about 0.95:1 to about 1:1.

15. A method according to claim 12 wherein (b) comprises maintaining the substrate at a temperature of less than 70° C.

16. A method according to claim 12 wherein the oxygen-containing gas comprises ozone.

17. A method according to claim 12 comprising generating the BDEAS by flowing carrier gas through a vaporizer to vaporize liquid BDEAS.

18. A method according to claim 12 comprising introducing the BDEAS and oxygen-containing gases through separate gas conduits so that the gases mix in a mixing zone immediately above the process zone.

19. A method according to claim 18 comprising maintaining the mixing zone at a temperature of at least 90° C.

20. A method of forming a multilayer etch-resistant stack on a substrate, the method comprising:
(a) forming on the substrate, a patterned resist layer having a plurality of resist features that are spaced apart from one another;
(b) placing the substrate with the patterned resist layer in a process zone;
(c) introducing into the process zone, a process gas comprising BDEAS and an oxygen-containing gas comprising ozone;
(d) depositing a silicon dioxide layer on the patterned resist layer without energizing the process gas.

* * * * *